(12) United States Patent
Zhang et al.

(10) Patent No.: US 10,591,757 B2
(45) Date of Patent: Mar. 17, 2020

(54) DISPLAY PANEL AND DISPLAY DEVICE INCLUDING PHOTOELECTRIC CONVERSION ELEMENTS

(71) Applicants: BOE TECHNOLOGY GROUP CO., LTD., Beijing (CN); BEIJING BOE DISPLAY TECHNOLOGY CO., LTD., Beijing (CN)

(72) Inventors: Qiang Zhang, Beijing (CN); Yun Qiu, Beijing (CN); Xiang Feng, Beijing (CN); Sha Liu, Beijing (CN); Zhaokun Yang, Beijing (CN); Xiao Sun, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/956,248

(22) Filed: Apr. 18, 2018

(65) Prior Publication Data

US 2019/0094587 A1    Mar. 28, 2019

(30) Foreign Application Priority Data

Sep. 28, 2017    (CN) .......................... 2017 1 0898004

(51) Int. Cl.
*H01L 31/046* (2014.01)
*G02F 1/133* (2006.01)
(Continued)

(52) U.S. Cl.
CPC .......... *G02F 1/13306* (2013.01); *G02F 1/135* (2013.01); *G02F 1/133512* (2013.01);
(Continued)

(58) Field of Classification Search
CPC ................... G09F 27/007; G02F 1/135; G02F 2001/1352; H01L 31/046; H01L 27/3227
See application file for complete search history.

(56) References Cited

U.S. PATENT DOCUMENTS 9,472,602 B2 * 10/2016 Xu .......................... G09F 27/007
9,477,019 B2    10/2016 Li et al.
(Continued)

FOREIGN PATENT DOCUMENTS

CN            1570713 A         1/2005
CN          103913888 A         7/2014
(Continued)

OTHER PUBLICATIONS

The First Chinese Office Action dated Oct. 9, 2019; Appln. No. 201710898004.X.

*Primary Examiner* — Yuzhen Shen
(74) *Attorney, Agent, or Firm* — Ladas & Parry LLP; Hermine Valizadeh

(57) ABSTRACT

A display panel and a display device are provided. The display panel includes a display panel body, a power supply layer and a reflective structure layer. The display panel body includes a plurality of aperture areas and a non-transparent area surrounding each of the plurality of aperture areas; the power supply layer is disposed at a display side of the display panel body and includes a plurality of photoelectric conversion elements; and the reflective structure layer is disposed between the power supply layer and the display panel body, the plurality of photoelectric conversion elements are spaced apart to form a plurality of transparent openings, the reflective structure layer includes a plurality of reflective structures, the plurality of reflective structures are configured to reflect light emergent from plurality of aperture areas to the plurality of transparent openings.

20 Claims, 4 Drawing Sheets

(51) Int. Cl.
  *G02F 1/1335* (2006.01)
  *G02F 1/135* (2006.01)
  *H01L 31/048* (2014.01)
  *H01L 31/042* (2014.01)
  *H01L 31/054* (2014.01)

(52) U.S. Cl.
  CPC ...... *G02F 1/133524* (2013.01); *H01L 31/042* (2013.01); *H01L 31/046* (2014.12); *H01L 31/048* (2013.01); *H01L 31/0547* (2014.12); *G02F 2001/1352* (2013.01); *G02F 2001/13324* (2013.01)

(56) References Cited

U.S. PATENT DOCUMENTS

| | | | |
|---|---|---|---|
| 9,711,673 B2 * | 7/2017 | Kerzabi | H01L 31/0547 |
| 9,716,197 B2 | 7/2017 | Kerzabi | |
| 2009/0185120 A1 * | 7/2009 | Yoon | G02F 1/13306 349/116 |

FOREIGN PATENT DOCUMENTS

| | | | | |
|---|---|---|---|---|
| CN | 104020587 A | | 9/2014 | |
| CN | 105761629 A | | 7/2016 | |
| CN | 105794002 A | | 7/2016 | |
| JP | 2008-164851 A | | 7/2008 | |
| JP | 2008164851 | * | 7/2008 | G06F 9/00 |

* cited by examiner

First direction

DISPLAY PANEL AND DISPLAY DEVICE INCLUDING PHOTOELECTRIC CONVERSION ELEMENTS

The present application claims priority of China Patent application No. 201710898004.X filed on Sep. 28, 2017, the content of which is incorporated in its entirety as portion of the present application by reference herein.

TECHNICAL FIELD

Embodiments of the present disclosure relate to a display panel and a display device.

BACKGROUND

With the continuous development of electronic products, smart phone and wearable electronic device have become essential products in people's lives. A usual smart phone includes a processor, a memory, a display panel, a battery, and various function modules.

Solar cell is also called "solar chip" or "photocell", which is a photoelectric semiconductor sheet generating electricity directly by using sunlight. As long as the solar cell is illuminated by light that satisfies certain illumination conductions, it can instantaneously output a voltage and generate current in the presence of a loop. The solar cell is a device which can directly convert light energy to electrical energy through the photoelectric effect or the photochemical effect.

SUMMARY

At least one embodiment of the present disclosure provides a display panel, which including: a display panel body, including a plurality of aperture areas and a non-transparent area surrounding each of the plurality of aperture areas; a power supply layer, disposed at a display side of the display panel body and including a plurality of photoelectric conversion elements; and a reflective structure layer, disposed between the power supply layer and the display panel body, the plurality of photoelectric conversion elements are spaced apart to form a plurality of transparent openings, the reflective structure layer includes a plurality of reflective structures, the plurality of reflective structures are configured to reflect light emergent from the plurality of aperture areas to the plurality of transparent openings.

For example, in the display panel provided by an example of the present disclosure, the plurality of transparent openings are disposed in one-to-one correspondence with the plurality of aperture areas, each of the plurality of reflective structures is configured to reflect the light emergent from each of the plurality of aperture areas to a corresponding one of the plurality of transparent openings.

For example, in the display panel provided by an example of the present disclosure, an orthogonal projection of each of the plurality of photoelectric conversion elements on the display panel body at least partially overlaps with the non-transparent area, an orthogonal projection of each of the plurality of transparent openings on the display panel body at least partially overlaps with the plurality of aperture areas.

For example, in the display panel provided by an example of the present disclosure, a center of the orthogonal projection of each of the plurality of transparent openings on the display panel body overlaps with a center of the corresponding one of the plurality of aperture areas.

For example, in the display panel provided by an example of the present disclosure, each of the plurality of reflective structures includes a reflective surface, the reflective surface is respectively connected with an edge of the plurality of aperture areas and an edge of the plurality of transparent openings.

For example, in the display panel provided by an example of the present disclosure, each of the plurality of reflective structures includes a reflective surface, the reflective surface is respectively connected with an edge of the plurality of aperture areas and an edge of the plurality of transparent openings.

For example, in the display panel provided by an example of the present disclosure, each of the plurality of reflective structures includes a reflective surface, the reflective surface is respectively connected with an edge of the plurality of aperture areas and an edge of the plurality of transparent openings.

For example, in the display panel provided by an example of the present disclosure, each of the plurality of reflective structures includes a reflective surface, the reflective surface is respectively connected with an edge of the plurality of aperture areas and an edge of the plurality of transparent openings.

For example, in the display panel provided by an example of the present disclosure, a shape of each of the plurality of photoelectric conversion elements includes a strip-like shape, two adjacent ones of the plurality of photoelectric conversion elements are spaced apart in a first direction to form one of the plurality of transparent openings.

For example, in the display panel provided by an example of the present disclosure, for each of the plurality of transparent openings, the reflective surface includes a first sub-reflective surface and a second sub-reflective surface, the first sub-reflective surface and the second sub-reflective surface are respectively connected with edges of two of the plurality of photoelectric conversion elements adjacent to each of the plurality of transparent openings.

For example, in the display panel provided by an example of the present disclosure, the first sub-reflective surface and the second sub-reflective surface are planes, an angle between the first sub-reflective surface and a plane where the display panel body is located is in a range of 67.5 to 75 degrees, an angle between the second sub-reflective surface and the plane where the display panel body is located is in a range of 67.5 to 75 degrees.

For example, in the display panel provided by an example of the present disclosure, the first sub-reflective surface and the second sub-reflective surface are curved surfaces.

For example, in the display panel provided by an example of the present disclosure, each of the plurality of reflective structures includes a groove hollowed in the reflective structure layer, an inside wall of the groove is provided with a reflective material to form the reflective surface.

For example, in the display panel provided by an example of the present disclosure, the display panel body includes: an array substrate; an opposing substrate, cell-assembled to the array substrate; and a liquid crystal layer, disposed between the array substrate and the opposing substrate, wherein the array substrate includes a thin film transistor, the thin film transistor is located on the non-transparent area and overlaps with an orthogonal projection of the plurality of photoelectric conversion elements on the array substrate.

For example, in the display panel provided by an example of the present disclosure, the opposing substrate includes a black matrix, the black matrix completely overlaps with the non-transparent area.

For example, in the display panel provided by an example of the present disclosure, which further including: a power supply circuit, electrically connected with the plurality of photoelectric conversion elements and the display panel body respectively and configured to transmit electrical energy generated by the plurality of photoelectric conversion elements to the display panel body to drive the display panel body.

For example, in the display panel provided by an example of the present disclosure, a material of the plurality of photoelectric conversion elements includes any one selected from the group consisting of gallium arsenide, silicon, perovskite, and organic photoelectric material.

For example, in the display panel provided by an example of the present disclosure, an orthogonal projection of the power supply layer on the display panel body coincides with the display panel body.

For example, in the display panel provided by an example of the present disclosure, an area occupied by the plurality of photoelectric conversion elements in the power supply layer is 30% to 70% of an area of the power supply layer.

At least one embodiment of the present disclosure provides a display device, which includes the display panel in any one example as mentioned above.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
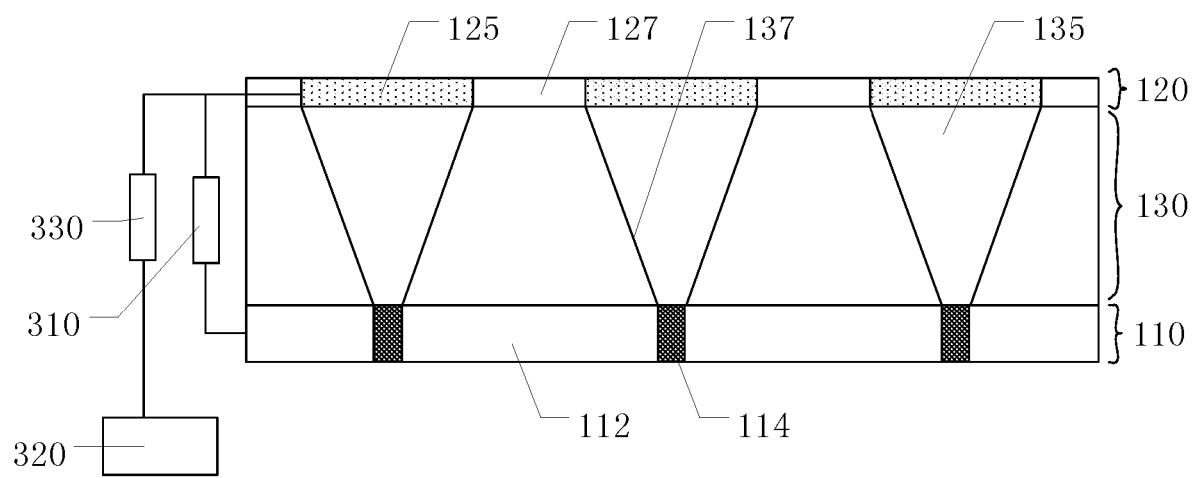
FIG. 1 is a structural schematic diagram of a display panel provided by an embodiment of the present disclosure.

In order to make objects, technical details and advantages of the embodiments of the present disclosure apparently, the technical solutions of the embodiments will be described in a clearly and fully understandable way in connection with the drawings related to the embodiments of the present disclosure. It is obvious that the described embodiments are just a part but not all of the embodiments of the present disclosure. Based on the described embodiments herein, a person having ordinary skill in the art may obtain other embodiment(s), without any inventive work, which should be within the scope of the disclosure.

Unless otherwise defined, the technical terms or scientific terms used herein have the same meanings as commonly understood by one of ordinary skill in the art to which the present disclosure belongs. The terms "first", "second", etc., which are used in the description and the claims of the present disclosure, are not intended to characterize any sequence, amount or importance, but distinguish various components. The terms "includes", "comprising", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

As more and more functions are integrated on electronic devices such as smart phones, tablet computers, and wearable electronic devices, the functional modules integrated on these electronic devices are also increasing, and the power consumption is also increasing, thereby resulting in shorter battery life of these electronic devices. However, these electronic devices cannot be charged anytime and anywhere, which reduces the user's user experience. In addition, on the one hand, these electronic devices are required to have larger screens and longer battery life, and on the other hand, these electronic devices are required to have advantages such as lightness and thinness. These electronic devices may become cumbersome by simply increasing the capacity of the battery, and it is unable to meet the needs of people.

Therefore, by means of adding a solar cell in these electronic devices, these electronic devices can convert natural light into electrical energy, so as to continuously provide power to these electronic devices, and extend the battery life. However, electronic devices such as smart phones and wearable electronic devices have a large display area and the percentage of an aperture area in the display area is relatively high, in order to avoid affecting the light emission rate of the display area, the solar cells need to be disposed to avoid the aperture area. Therefore, it is unable to dispose the solar cells with larger sizes, such that the power of the solar cells is relatively small, and cannot produce a good effect.

Therefore, at least one embodiment of the present disclosure provides a display panel and a display device. The display panel includes a display panel body, a power supply layer and a reflective structure layer. The display panel includes a plurality of aperture areas and a non-transparent area surrounding each of the plurality of aperture areas; the power supply layer is disposed at a display side of the display panel body and includes a plurality of photoelectric conversion elements; the reflective structure layer is disposed between the power supply layer and the display panel body, the plurality of photoelectric conversion elements are spaced apart to form a plurality of transparent openings, the reflective structure layer includes a plurality of reflective structures, the plurality of reflective structures are configured to reflect light emergent from the plurality of aperture areas to the plurality of transparent openings. Therefore, the photoelectric conversion elements are integrated into the display panel so that natural light can be converted into electrical energy, and the reflective structure layer is used to reflect light emitted from the plurality of aperture areas of the display panel body through the transparent openings between the photoelectric conversion elements; therefore, on the one hand, it can be realized that the photoelectric conversion elements with the larger sizes can be disposed to provide a greater electric power, and on the other hand, it can be avoided that the photoelectric conversion elements shield the light emitted from the plurality of aperture areas of the display panel body, so as to prevent the photoelectric conversion elements from affecting the normal display.

Hereafter, the display panel and the display device provided by embodiments of the present disclosure will be described in detail with reference to the accompanying drawings.

FIG. 1 is a structural schematic diagram of a display panel provided by an embodiment of the present disclosure. As illustrated in FIG. 1, the display panel includes a display panel body 110, which includes a plurality of aperture areas 112 and a non-transparent area 114 surrounding each of the plurality of aperture areas 112; a power supply layer 120, disposed at a display side of the display panel body 110 and including a plurality of photoelectric conversion elements 125; and a reflective structure layer 130, disposed between the power supply layer 120 and the display panel body 110, the plurality of photoelectric conversion elements 125 are spaced apart to form a plurality of transparent openings 127, the reflective structure layer 130 includes a plurality of reflective structures 135, the plurality of reflective structures 135 are configured to reflect light emergent from the plurality of aperture areas 112 to the plurality of transparent openings 127. It should be noted that, the abovementioned aperture area and the non-transparent area can be located on a display area of the display panel body; for example, when the display panel is a liquid crystal display panel, the aperture area can be an area corresponding to each pixel unit in the liquid crystal display panel, the non-transparent area can be an area corresponding to a black matrix surrounding the pixel unit.

In the display panel provided by the present embodiment, the photoelectric conversion elements can be used to convert natural light or light emitted by other light source into electrical energy, so as to supply power to the display panel. In addition, the reflective structure layer can be used to reflect the light emitted from the plurality of aperture areas of the display panel body to the transparent openings between the photoelectric conversion elements, that is, the photoelectric conversion elements can be disposed without avoiding the plurality of aperture areas, therefore, on the one hand, it can be realized that the photoelectric conversion elements with the larger sizes can be disposed to provide a greater electric power, so as to make the display panel have a higher self-charging capability, and on the other hand, it can be avoided that the photoelectric conversion elements shield the light emitted from the plurality of aperture areas of the display panel body, so as to prevent the photoelectric conversion elements from affecting the normal display. Furthermore, since the light emitted from the aperture area of the display panel body is reflected (one or more times) by the reflective structure layer, an angle range of the light emergent of the display panel can be increased, so that a viewing angle of the display panel can be increased.

For example, in some examples, as illustrated in FIG. 1, the plurality of transparent openings 127 are disposed in one-to-one correspondence with the plurality of aperture areas 112, the plurality of reflective structures 135 are configured to reflect the light emergent from each of the plurality of aperture areas 112 to a corresponding one of the plurality of transparent openings 127.

For example, in some examples, as illustrated in FIG. 1, an orthogonal projection of each of the plurality of photoelectric conversion elements 125 on the display panel body 110 at least partially overlaps with the non-transparent area 114. Therefore, the photoelectric conversion elements can make full use of area of the non-transparent area. It should be noted that, the abovementioned transparent openings refer to an area between two of the photoelectric conversion elements.

For example, in some examples, as illustrated in FIG. 1, an orthogonal projection of each of the plurality of transparent openings 127 on the display panel body 110 at least partially overlaps with a corresponding one of the plurality of aperture areas 112 of the display panel body 110, so that it is convenient for the reflective structure layer to reflect the light emitting from the plurality of aperture areas of the display panel body to the transparent openings among the photoelectric conversion elements.

For example, in some examples, as illustrated in FIG. 1, a center of the orthogonal projection of each of the plurality of transparent openings 127 on the display panel body 110 is directly opposite to a center of a corresponding one of the plurality of aperture areas 112, that is, the center of the orthogonal projection of each of the transparent openings 127 on the display panel body 110 coincides with the center of a corresponding one of the plurality of aperture areas 112.

For example, in some examples, as illustrated in FIG. 1, the size of the photoelectric conversion elements 125 is greater than the size of the non-transparent area 114. That is, the orthogonal projection of each of the plurality of photoelectric conversion elements 125 on the display panel body 110 partially overlaps with the aperture area 112 of the display panel body. Since the reflective structure layer can be used to reflect the light emitted from the aperture area of the display panel body to the transparent opening between the photoelectric conversion elements, that is, the photoelectric conversion elements can be disposed without avoiding the aperture area, therefore the photoelectric conversion elements can partially overlap with the aperture area, without affecting the emission of the light emitted from the aperture area, so that it can be realized that the photoelectric conversion elements with the larger sizes can be disposed to provide greater electric power.

For example, in some examples, as illustrated in FIG. 1, each of the plurality of reflective structures 135 includes a reflective surface 137, the reflective surface 137 is respectively connected with an edge of the aperture area 112 and an edge of the transparent opening 127. Because the reflective surface 137 is respectively connected with the edge of the aperture area 112 and the edge of the transparent openings 127, it can be ensured that the light emitted from the aperture area 112 can be emitted directly from the transparent opening 127, or reflected (one or more reflections) by the reflective surface 137, and then emitted from the transparent openings 127, so that the loss of light transmittance caused by the setting of the photoelectric conversion elements can be greatly reduced.

It should be noted that, because the non-transparent area 113 surrounds the aperture area 112, the plurality of photoelectric conversion elements 125 are spaced apart to form the plurality of transparent openings 127, and the reflective surface 137 is respectively connected with the edge of the aperture area 112 and the edge of the transparent openings 127, that is, the reflective surface 137 can be connected with the edge of the non-transparent area 114, and can be connected with the edge of the photoelectric conversion elements 125.

For example, in some examples, as illustrated in FIG. 1, each of the reflective structures 135 can be a groove 135 hollowed in the reflective structure layer 130, an inside wall of the groove 135 is provided with a reflective material to form the reflective surface 137.

For example, the material of the reflective structure layer can be selected from materials with lower reflective index to reduce the loss of light from the reflective structure layer to the air.

For example, the reflective material can be silver, which can make the reflectance of the reflective surface higher. Certainly, the embodiments of the present disclosure includes but is not limited thereto, the reflective material can be other materials have a reflective capability, such as aluminum and other metal reflective materials.

For example, the groove can be formed by nanoimprinting. That is, the reflective structure layer can be formed by first forming a transparent material layer on the display panel body, and then forming the groove hollowed in the transparent material layer in the transparent material layer by nanoimprinting.

For example, in some examples, as illustrated in FIG. 1, the display panel further includes a power supply circuit 310. The power supply circuit 310 is electrically connected with the plurality of photoelectric conversion elements 125 and the display panel body 110, respectively, so as to transmit electrical energy generated by the plurality of photoelectric conversion elements 125 to the display panel body 110 to drive the display panel body 110.

For example, the power supply circuit can include sub-circuits such as a voltage stabilization circuit, an electrostatic protection circuit and so on, thereby converting the electrical energy generated by the plurality of photoelectric conversion elements into safe and stable electrical energy.

For example, the power supply circuit can be electrically connected with the plurality of photoelectric conversion elements through wires. It should be noted that, the wires can be disposed corresponding to the non-transparent area of the display panel body to prevent the wires from affecting the light transmittance of the display panel.

For example, in some examples, as illustrated in FIG. 1, the display panel further includes a first battery 320 and a charging circuit 330. The charging circuit 330 is electrically connected with the plurality of photoelectric conversion elements 125 and the first battery 320, respectively; so that the electrical energy generated by the photoelectric conversion elements 125 can be transmitted to the first battery 320 and stored therein. Therefore, the display panel can store the electrical energy generated by the plurality of photoelectric conversion elements to the first battery when the power consumption is lower, and then transmit the electrical energy in the first battery to the display panel body for display when the power consumption is higher.

For example, similar to the power supply circuit, the charging circuit can also be electrically with the plurality of photoelectric conversion elements through the wires. Similarly, in order to prevent the wires from affecting the light transmittance of the display panel, the wires can be disposed corresponding to the non-transparent area of the display panel body.

For example, in some examples, as illustrated in FIG. 1, the charging circuit 330 and the power supply circuit 310 can be integrated together.

For example, in some examples, as illustrated in FIG. 1, an orthogonal projection of the power supply layer 120 on the display panel body 110 coincides with the display panel body 110. Therefore, the power supply layer 120 can make maximum use of the area of the display panel body 110, so as to increase the total area of the plurality of photoelectric conversion elements 135 in the power supply layer 120, thereby improving the electric power of the power supply layer 120.

For example, in some examples, the area occupied by the plurality of photoelectric conversion elements on the power supply layer is 30%-70% of the area of the power supply layer. For a usual display panel (that is the display panel body in the present disclosure), the aperture area accounts for about 70% of the area of the display panel, and the non-transparent area accounts for about 30% of the area of the display panel, when the area of the power supply layer is the same as that of the display panel body, the area occupied by the plurality of photoelectric conversion elements in the power supply layer can be set to 30%-70% of the area of the power supply layer to increase the electric power of the power supply layer. Furthermore, when the area occupied by the plurality of photoelectric conversion elements on the power supply layer is 30%-70% of the area of the power supply layer, at this moment, the area occupied by the transparent openings on the power supply layer is 30%-70% of the area of the power supply layer, therefore, it can be ensured that the transparency of the display panel is not affected at the same time.

For example, in some examples, the area occupied by the plurality of photoelectric conversion elements on the power supply layer is 50%-70% of the area of the power supply layer, so as to ensure that the power supply layer has higher electric power.

Figure 2:
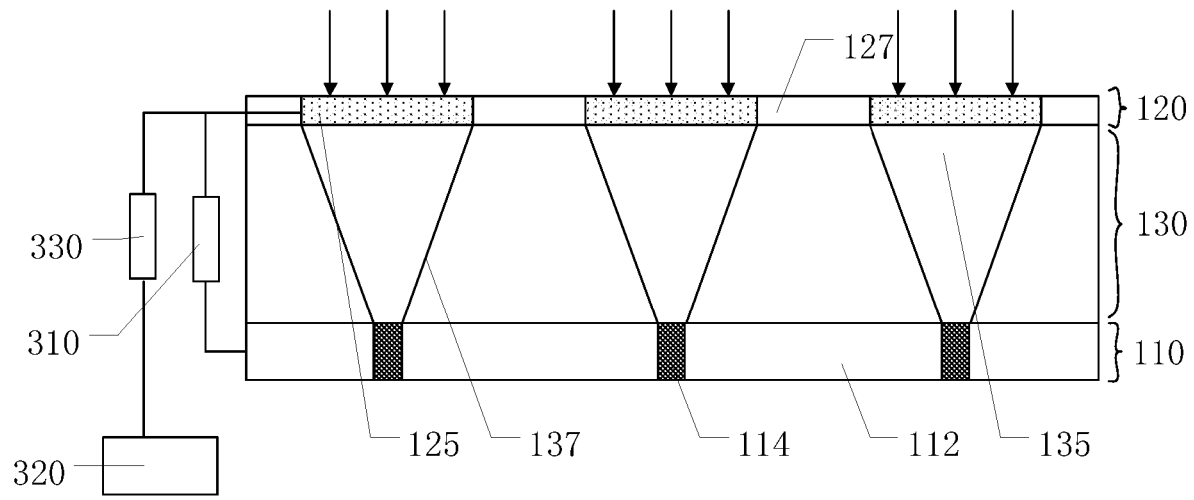
FIG. 2 is a work schematic diagram of a display panel provided by an embodiment of the present disclosure.

FIG. 2 is a work schematic diagram of a display panel provided by an embodiment of the present disclosure. As illustrated in FIG. 2, the display panel is in a charging process, upon natural light from the environment or light from other light source reaching the display panel, the light irradiated on the photoelectric conversion elements can be converted into electrical energy and the electrical energy can be outputted to the display panel body through the power supply circuit or the first battery through the charging circuit. Therefore, the display panel can convert natural light of light emitted from other source light into the electrical energy through the photoelectric conversion elements to supply power to the display panel or store the electrical energy in the first battery, so as to reduce the power consumption of the display panel, and extend the battery life of a display device using the display panel.

Figure 3:
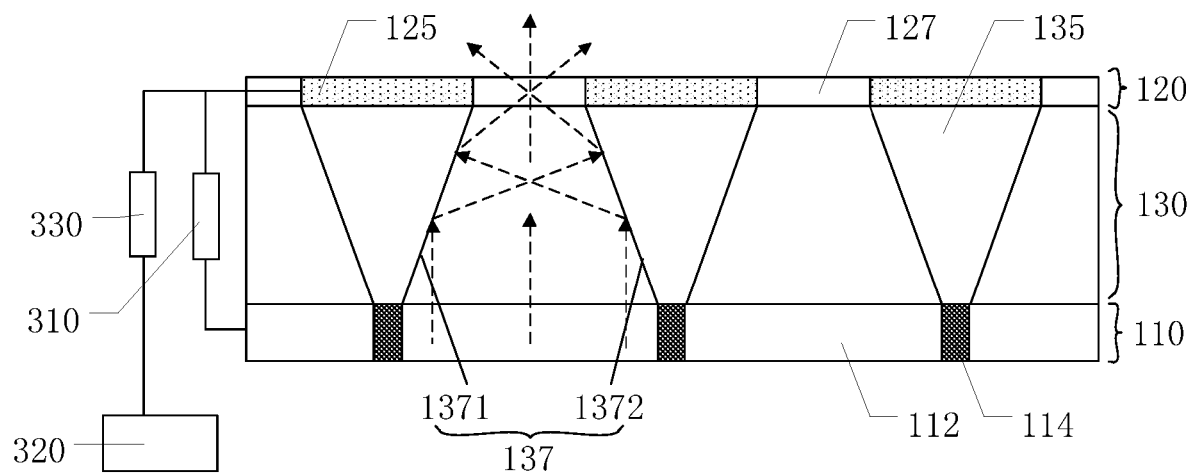
FIG. 3 is a work schematic diagram of another display panel provided by an embodiment of the present disclosure.

FIG. 3 is a work schematic diagram of another display panel provided by an embodiment of the present disclosure. As illustrated in FIG. 3, the display panel is in a display process, a part of the light emergent from the aperture area 112 of the display panel body 110 can be directly emitted from the transparent openings 127, and another part can be reflected by the reflective surface 137 and then exits from the transparent openings 127. Therefore, the display panel can utilize the reflective structure layer to reflect the light emitted from the aperture area of the display panel body through the transparent openings between the photoelectric conversion elements, that is, the photoelectric conversion elements can be disposed without avoiding the aperture area, therefore, on the one hand, it can be realized that the photoelectric conversion elements with relatively large sizes can be disposed to provide greater electric power so as to make the display panel have a higher self-charging capability, and on the other hand, the photoelectric conversion elements can be prevented from shielding the light emitted from the aperture area of the display panel body, so as to prevent the photoelectric conversion elements from affecting the normal display.

It should be noted that, in order to clearly illustrate the working principle of the display panel, FIG. 2 and FIG. 3 respectively illustrate views of a charging process and a display process of the display panel. However, embodiments of the present disclosure do not limit that the charging process and the display process of the display panel need to be separately performed, and the display panel can also perform the charging process and the display process at the same time.

For example, in some examples, as illustrated in FIG. 3, for each of the plurality of transparent openings 127, the reflective surface 137 includes a first sub-reflective surface 1371 and a second sub-reflective surface 1372; the first sub-reflective surface 1371 and the second sub-reflective surface 1372 are respectively connected with edges of two photoelectric conversion elements 125 adjacent to the transparent opening 127. As illustrated in FIG. 3, a part of the light emergent from the aperture area 112 of the display panel body 110 can be reflected by the first sub-reflective surface 1371, and then reflected by the second sub-reflective surface 1372, and finally exits from the transparent openings 127.

Figure 4:
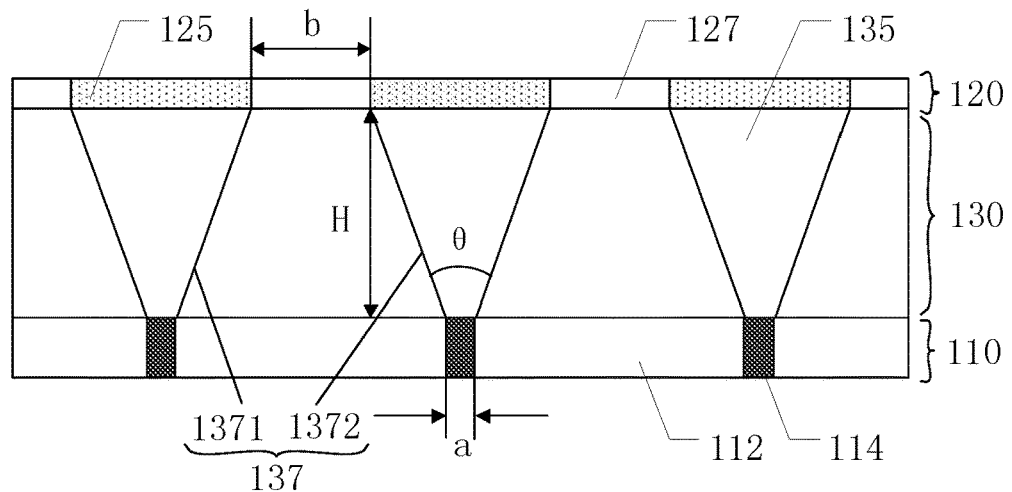
FIG. 4 is a structural schematic diagram of another display panel provided by an embodiment of the present disclosure.
Figure 5:
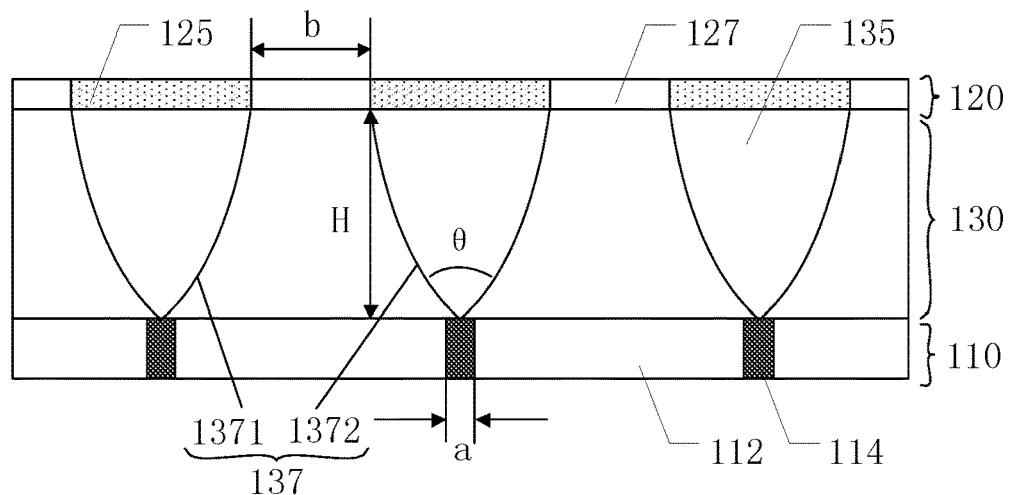
FIG. 5 is a structural schematic diagram of another display panel provided by an embodiment of the present disclosure.

FIG. 4 is a structural schematic diagram of another display panel provided by an embodiment of the present disclosure. As illustrated in FIG. 4, the first sub-reflective surface 1371 and the second sub-reflective surface 1372 are planes. In order to ensure that the light emergent from the aperture area 112 of the display panel body 110 can be reflected out from the transparent openings 127 through the first sub-reflective surface 1371 and the second sub-reflective surface 1372, an angle between the first sub-reflective surface 1371 and a plane where the display panel body 110 is located is in a range of 67.5 to 75 degrees, an angle between the second sub-reflective surface 1372 and the plane where the display panel body 110 is located is in a range of 67.5 to 75 degrees. Certainly, embodiments of the present disclosure are not limited thereto, for example, FIG. 5 is a structural schematic diagram of another display panel provided by an embodiment of the present disclosure. As illustrated in FIG. 5, the first sub-reflective surface and the second sub-reflective surface are also curved surfaces, as long as the first sub-reflective surface and the second sub-reflective surface can reflect the light emergent from the aperture area to the transparent openings.

For example, the angle between the first sub-reflective surface 1371 and the plane where the display panel body 110 is located is in a range of 67.5 to 70 degrees, the angle between the second sub-reflective surface 1372 and the plane where the display panel body 110 is located is in a range of 67.5 to 70 degrees. The angle between the first sub-reflective surface and the plane where the display panel body is located and the angle between the second sub-reflective surface and the plane where the display panel body is located are set to be smaller so as to reduce the thickness of the reflective structure.

For example, in some examples, as illustrated in FIG. 4, the width of the non-transparent area 114 of the display panel body 110 is a; the width of each of the transparent openings 127 is b, that is, the spacing between adjacent photoelectric conversion elements 125 is b; an angle between the first sub-reflective surface 1371 and the second sub-reflective surface 1372 is θ; the thickness of the reflective structure layer 130 is H. For the display panel body 110 with a certain resolution, the width a of the non-transparent area 114 have constant values; because the angle between the first sub-reflective surface 1371 and the plane where the display body 110 is located can be set in a range of 67.5 to 70 degrees, the angle between the second sub-reflective surface 1372 and the plane where the display body 110 is located can be set in a range of 67.5 to 70 degrees, the angle θ between the first sub-reflective surface 1371 and the second sub-reflective surface 1372 can be set in a range of 30 to 45 degrees. Furthermore, the area of the photoelectric conversion elements 125 in the power supply layer 120 can be designed and determined according to a specific condition, once the area is determined, the width of the transparent openings 127 or the spacing b between adjacent photoelectric conversion elements have a constant value. Furthermore, the thickness H of the reflective structure layer 130 can be calculated according to the abovementioned a, b and θ. For example, the thickness H of the reflective structure layer 130 can be calculated according to the following formula:

$$H = \frac{a-b}{2\tan\frac{\theta}{2}}$$

For example, in some examples, the photoelectric conversion elements are elements that directly convert light energy into electrical energy through a photoelectric effect or a photochemical effect. For example, the photoelectric conversion elements can be thin film solar cells.

For example, in some examples, the photoelectric conversion elements can include a first extrinsic semiconductor layer and a second extrinsic semiconductor layer which are laminated, and an intrinsic semiconductor layer disposed between the first extrinsic semiconductor layer and the second extrinsic semiconductor layer. It should be noted that, the first extrinsic semiconductor layer has a first doping type, the second extrinsic semiconductor layer has a second doping type, for example, the first doping type can be p type, the second doping type can be n type, or, the first doping type can be n type, the second doping type can be p type.

For example, in some examples, a material of the plurality of photoelectric conversion elements includes any one selected from a group consisting of gallium arsenide, silicon, perovskite, and organic photoelectric material.

Figure 6:
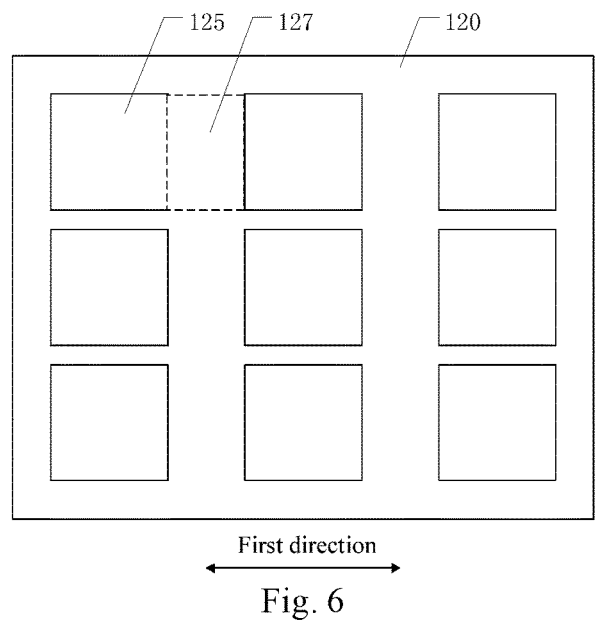
FIG. 6 is a plan view of a power supply layer in a display panel provided by an example of the present disclosure.

FIG. 6 is a plan view of a power supply layer in a display panel provided by an example of the present disclosure. As illustrated in FIG. 6, the shape of the photoelectric conversion elements 125 includes a rectangle shape, two adjacent photoelectric conversion elements 125 are spaced apart in a first direction to form the plurality of transparent openings 127. It should be noted that, the abovementioned first direction can be a row direction of the pixels arranged in an array in the display panel body.

Figure 7:
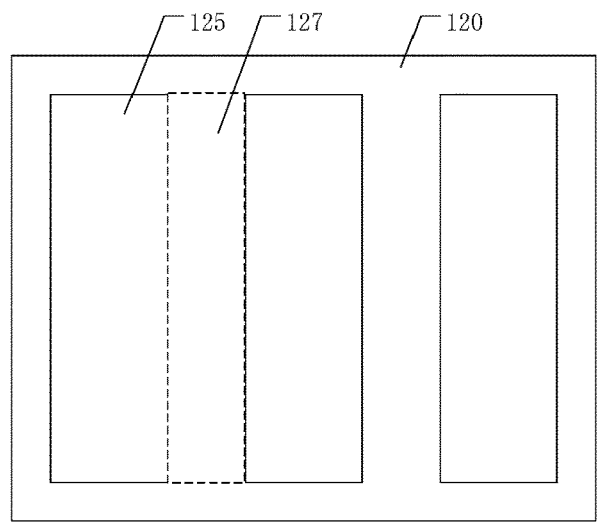
FIG. 7 is a plan view of a power supply layer in another display panel provided by an example of the present disclosure.

FIG. 7 is a plan view of a power supply layer in another display panel provided by an example of the present disclosure. As illustrated in FIG. 7, the shape of the photoelectric conversion elements 125 includes a strip-like shape, two adjacent photoelectric conversion elements 125 are spaced apart in the first direction to form the plurality of transparent openings 127. As illustrated in FIG. 7, the photoelectric conversion elements 125 can be extended to opposite ends of the power supply layer 120.

Figure 8:
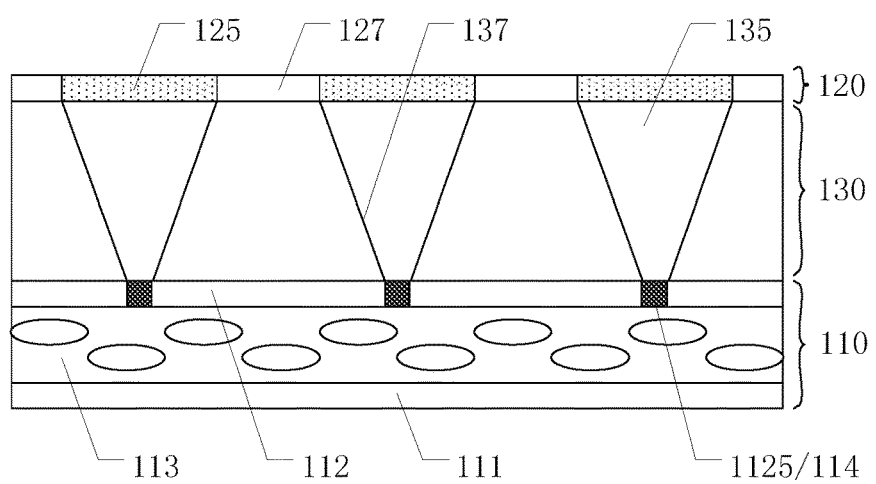
FIG. 8 is a structural schematic diagram of another display panel provided by an embodiment of the present disclosure.

FIG. 8 is a structural schematic diagram of another display panel provided by an embodiment of the present disclosure. The display panel body can be a liquid crystal display panel, as illustrated in FIG. 8, the display panel body 110 includes an array substrate ill, an opposing substrate cell-assembled to the array substrate 111, and a liquid crystal layer 113 disposed between the array substrate 111 and the opposing substrate 112.

Figure 9:
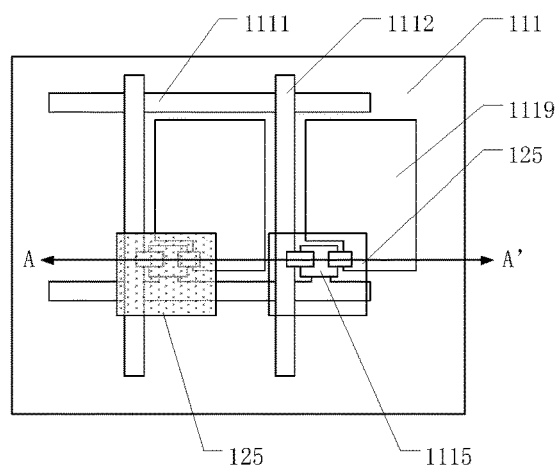
FIG. 9 is a partial plan view of a display panel provided by an embodiment of the present disclosure.

FIG. 9 is a partial planar view of a display panel provided by an embodiment of the present disclosure. As illustrated in FIG. 8 and FIG. 9, the array substrate 111 is provide with a thin film transistor 1115, the thin film transistor 1115 is located on the non-transparent area 114 and overlaps with an orthogonal projection of the plurality of photoelectric conversion elements 125 on the array substrate 111. Because a usual thin film transistor is non-transparent, and the area occupied by the thin film transistor is larger than that of the other non-transparent structures such as a gate line 1111, a data line 1112 and the like, the photoelectric conversion elements 125 can be disposed according to the thin film transistor 1115 so as to fully utilize the area occupied by the thin film transistor 1115. It should be noted that, in order to clearly illustrate the relationship between the thin film transistor on the array substrate and the photoelectric conversion elements of the power supply layer, the opposing substrate between the array substrate and the power supply layer is not illustrated in FIG. 9. Furthermore, FIG. 8 can be a sectional view of a display panel along A-A' in FIG. 9 provided by an embodiment of the present disclosure.

For example, in some examples, as illustrated in FIG. 9, the array substrate 111 further includes a pixel electrode 1119, which is electrically connected with the thin film transistor 1115. The pixel electrode 1119 on the array substrate 111 is located on the aperture area 112 of the display panel body 110. It should be noted that, a specific structure of the thin film transistor 1115 can refer to a usual design, which is not repeated herein.

For example, in some examples, as illustrated in FIG. 8, the opposing substrate 112 includes a black matrix 1125, the black matrix 1125 completely overlaps with the non-transparent area 114. That is, when the display panel body is a liquid crystal display panel, the non-transparent area is the black matrix.

For example, in some examples, the black matrix on the opposing substrate can cover the thin film transistor, the gate line and the data line on the array substrate.

For example, in some examples, the display panel body can be other display panel structures, such as an organic light emitting diode display panel or an electronic paper.

Figure 10:
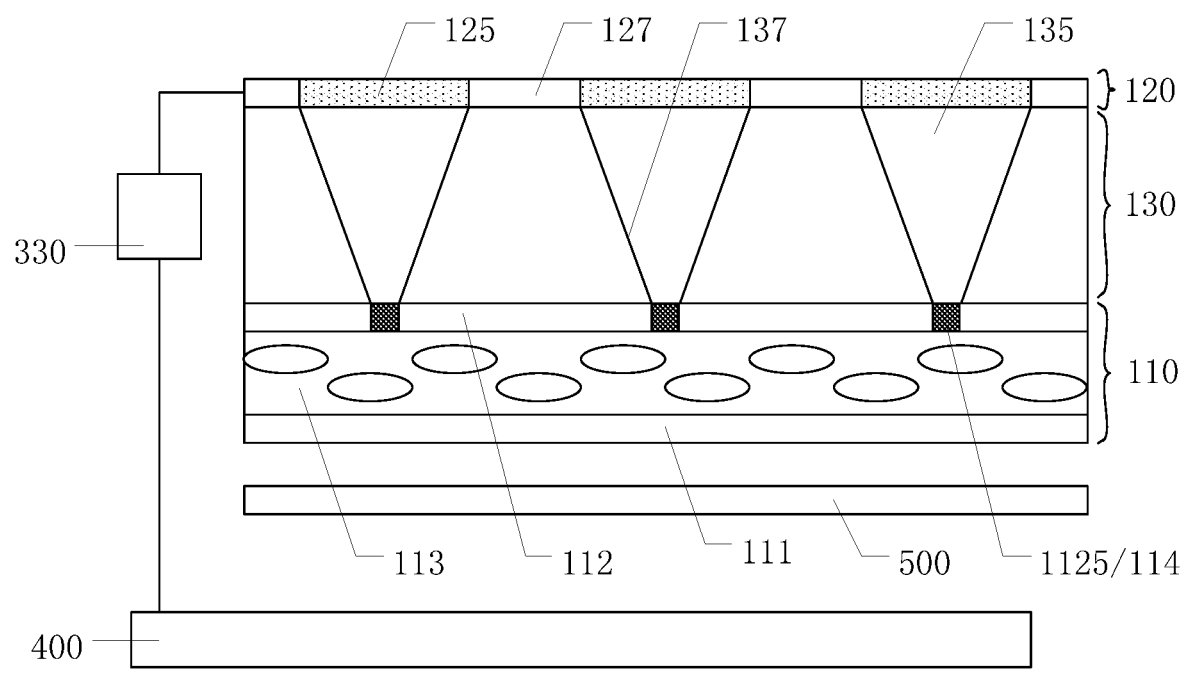
FIG. 10 is a structural schematic diagram of a display device provided by an embodiment of the present disclosure.

An embodiment of the present embodiment further provides a display device. FIG. 10 is a structural schematic diagram of a display device provided by an embodiment of the present embodiment. As illustrated in FIG. 10, the display panel includes the display panel described in any of the abovementioned examples. Therefore, the display device has beneficial effects corresponding to the beneficial effects of the display panel included in the display device, which is not be described in detail in the present embodiment. In addition, other structures or components in the display device can refer to a usual design, which is not be described in detail in the present embodiment.

For example, in some examples, as illustrated in FIG. 10, the display panel body 110 in the display device can be a liquid crystal display panel, at this moment, the display device further includes a black module 500 to provide a backlight for the liquid crystal display panel.

For example, in some examples, as illustrated in FIG. 10, the display device further includes a second battery 400. When the display device employs a display panel having a charging circuit 330, the charging circuit 330 can also be electrically connected with the second battery 400, so that the electrical energy generated by the photoelectric conversion elements 125 can be transmitted to the second battery 400 and stored therein.

For example, in some examples, the display device can be an electronic device such as a smart phone, a tablet computer, a wearable electronic device and so on, so that the battery life of these electronic devices can be extended. Certainly, the present embodiment includes but is not limited thereto, the display device can also be any product or component with a display function such as a television, a display, a notebook computer, a digital photo frame, a navigator, and the like.

The following points should to be explained:

1) The drawings of at least one embodiment of the present disclosure only relate to the structure in the embodiment of the present disclosure, and other structures may be referenced to the usual design.

2) In the absence of conflict, the features of the same embodiment and the different embodiments can be combined with each other.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display panel, comprising:
   a display panel body, comprising a plurality of aperture areas and a non-transparent area surrounding each of the plurality of aperture areas;
   a power supply layer, disposed at a display side of the display panel body and comprising a plurality of photoelectric conversion elements; and
   a reflective structure layer, disposed between the power supply layer and the display panel body,
   wherein the plurality of photoelectric conversion elements are spaced apart to form a plurality of transparent openings, the reflective structure layer comprises a plurality of reflective structures, the plurality of reflective structures are configured to reflect light emergent from the plurality of aperture areas to the plurality of transparent openings,
   wherein each of the plurality of reflective structures comprises a reflective surface, and the reflective surface is respectively connected with an edge of the non-transparent area and an edge of the photoelectric conversion elements,
   wherein an orthogonal projection of each of the plurality of photoelectric conversion elements on the display panel body at least partially overlaps with the non-transparent area, and at least partially overlaps with a corresponding one of the plurality of aperture areas.

2. The display panel according to claim 1, wherein the plurality of transparent openings are disposed in one-to-one correspondence with the plurality of aperture areas, the plurality of reflective structures is configured to reflect the light emergent from the each of the plurality of aperture areas to a corresponding one of the plurality of transparent openings.

3. The display panel according to claim 2, wherein the reflective surface is respectively connected with an edge of the plurality of aperture areas and an edge of the plurality of transparent openings.

4. The display panel according to claim 1, wherein an orthogonal projection of each of the plurality of transparent openings on the display panel body at least partially overlaps with a corresponding one of the plurality of aperture areas.

5. The display panel according to claim 4, wherein a center of the orthogonal projection of each of the plurality of transparent openings on the display panel body overlaps with a center of the corresponding one of the plurality of aperture areas.

6. The display panel according to claim 5, wherein the reflective surface is respectively connected with an edge of the plurality of aperture areas and an edge of the plurality of transparent openings.

7. The display panel according to claim 4, wherein the reflective surface is respectively connected with an edge of the plurality of aperture areas and an edge of the plurality of transparent openings.

8. The display panel according to claim 1, wherein the reflective surface is respectively connected with an edge of the plurality of aperture areas and an edge of the plurality of transparent openings.

9. The display panel according to claim 8, wherein for each of the plurality of transparent openings, the reflective surface comprises a first sub-reflective surface and a second sub-reflective surface, the first sub-reflective surface and the second sub-reflective surface are respectively connected with edges of two of the plurality of photoelectric conversion elements adjacent to a corresponding one of the plurality of transparent openings.

10. The display panel according to claim 9, wherein the first sub-reflective surface and the second sub-reflective surface are planes,
an angle between the first sub-reflective surface and a plane where the display panel body is located is in a range of 67.5 to 75 degrees, an angle between the second sub-reflective surface and the plane where the display panel body is located is in a range of 67.5 to 75 degrees.

11. The display panel according to claim 9, wherein the first sub-reflective surface and the second sub-reflective surface are curved surfaces.

12. The display panel according to claim 8, wherein each of the plurality of reflective structures comprises a groove hollowed in the reflective structure layer, an inside wall of the groove is provided with a reflective material to form the reflective surface.

13. The display panel according to claim 1, wherein a shape of each of the plurality of photoelectric conversion elements comprises a strip-like shape, two adjacent ones of the plurality of photoelectric conversion elements are spaced apart in a first direction to form one of the plurality of transparent openings.

14. The display panel according to claim 1, wherein the display panel body comprises:
an array substrate;
an opposing substrate, cell-assembled to the array substrate; and
a liquid crystal layer, disposed between the array substrate and the opposing substrate,
wherein the array substrate comprises a thin film transistor, the thin film transistor is located in the non-transparent area and overlaps with an orthogonal projection of the plurality of photoelectric conversion elements on the array substrate.

15. The display panel according to claim 14, wherein the opposing substrate comprises a black matrix, the black matrix completely overlaps with the non-transparent area.

16. The display panel according to claim 1, further comprising:
a power supply circuit, electrically connected with the plurality of photoelectric conversion elements and the display panel body respectively and configured to transmit electrical energy generated by the plurality of photoelectric conversion elements to the display panel body to drive the display panel body.

17. The display panel according to claim 1, wherein a material of the plurality of photoelectric conversion elements comprises any one selected from the group consisting of gallium arsenide, silicon, perovskite, and organic photoelectric material.

18. The display panel according to claim 1, wherein an orthogonal projection of the power supply layer on the display panel body coincides with the display panel body.

19. The display panel according to claim 1, where an area occupied by the plurality of photoelectric conversion elements in the power supply layer is 30% to 70% of an area of the power supply layer.

20. A display device, comprising the display panel according to claim 1.

* * * * *